(12) United States Patent
Bywalez et al.

(10) Patent No.: US 12,074,120 B2
(45) Date of Patent: Aug. 27, 2024

(54) ELECTRIC COMPONENT WITH PAD FOR A BUMP AND MANUFACTURING METHOD THEREOF

(71) Applicant: RF360 SINGAPORE PTE. LTD., Republic Plaza (SG)

(72) Inventors: Robert Felix Bywalez, Munich (DE); Ute Steinhaeusser, Munich (DE); Monika Schmiedgen, Olching (DE)

(73) Assignee: RF360 Singapore Pte. Ltd., Singapore (SG)

( * ) Notice: Subject to any disclaimer, the term of this patent is extended or adjusted under 35 U.S.C. 154(b) by 262 days.

(21) Appl. No.: 17/620,644

(22) PCT Filed: Jun. 9, 2020

(86) PCT No.: PCT/EP2020/065898
§ 371 (c)(1),
(2) Date: Dec. 17, 2021

(87) PCT Pub. No.: WO2020/260005
PCT Pub. Date: Dec. 30, 2020

(65) Prior Publication Data
US 2022/0246546 A1 Aug. 4, 2022

(30) Foreign Application Priority Data
Jun. 26, 2019 (DE) ...................... 10 2019 117 214.4

(51) Int. Cl.
*H01L 21/48* (2006.01)
*H01L 23/00* (2006.01)
*H01L 23/498* (2006.01)

(52) U.S. Cl.
CPC ........ *H01L 23/564* (2013.01); *H01L 21/4846* (2013.01); *H01L 23/49894* (2013.01); *H01L 23/49811* (2013.01)

(58) Field of Classification Search
CPC ................ H01L 21/4846; H01L 21/48; H01L 2224/02163; H01L 2224/02185; H01L 2224/0219; H01L 2224/0401; H01L 2224/05166; H01L 2224/05555; H01L 2224/05571; H01L 2224/05572; H01L 2224/05644; H01L 2224/05655; H01L 23/291; H01L 23/3192; H01L 23/49811;
(Continued)

(56) References Cited

U.S. PATENT DOCUMENTS 5,709,904 A * 1/1998 Coleman, Sr. ......... G01N 30/56
427/230
2003/0073300 A1 4/2003 Chen et al.
(Continued)

OTHER PUBLICATIONS

International Search Report and Written Opinion—PCT/EP2020/065898—ISA/EPO—Oct. 7, 2020.

*Primary Examiner* — Timothy J Thompson
*Assistant Examiner* — Guillermo J Egoavil
(74) *Attorney, Agent, or Firm* — Polsinelli (57) ABSTRACT

A bump pad enclosure providing an improved reliability of a bump connection is provided. The bump pad enclosure comprises an electrode pad, a UBM and a first shield. The first shield covers at least a first perimeter area of the electrode pad. The first shield is provided and configured to shield the first perimeter area from a detrimental influence of the environment.

17 Claims, 5 Drawing Sheets

(58) Field of Classification Search
CPC . H01L 23/49894; H01L 23/564; H01L 23/00; H01L 23/498; H01L 24/05; H01L 2924/00014; H01L 2924/01022; H01L 2924/01079; H01L 2924/013; H01L 2924/3512
USPC .......................................... 174/258; 438/612
See application file for complete search history.

(56) References Cited

U.S. PATENT DOCUMENTS

| | | |
|---|---|---|
| 2003/0199159 A1* | 10/2003 | Fan .................. H01L 24/11 257/E23.021 |
| 2004/0115934 A1 | 6/2004 | Broz et al. |
| 2008/0006774 A1* | 1/2008 | Vergara Ogando ......................... H01L 27/1443 257/E31.093 |
| 2009/0218684 A1 | 9/2009 | Pavier et al. |
| 2011/0254159 A1 | 10/2011 | Hwang et al. |
| 2012/0273937 A1 | 11/2012 | Choi |
| 2013/0087908 A1 | 4/2013 | Yu et al. |
| 2013/0134563 A1 | 5/2013 | Chuang et al. |
| 2013/0147034 A1 | 6/2013 | Chen |
| 2015/0262953 A1 | 9/2015 | Lee et al. |
| 2019/0077915 A1* | 3/2019 | Yun .................. B32B 27/34 |
| 2019/0139917 A1 | 5/2019 | Lu et al. |

\* cited by examiner

ELECTRIC COMPONENT WITH PAD FOR A BUMP AND MANUFACTURING METHOD THEREOF

The present invention refers to bump pad enclosures that can improve the corrosion resistance of bump connections and correspondingly improve the reliability of electric devices.

Bump connections can be used to electrically and mechanically connect electrode pads of different electric components to establish an electric device comprising the two (and potentially more) electric components.

Usually, a bump connection comprises a solder material that is arranged between two electrode pads. Further, a contact between one of the electrode pads to the solder material is provided by a first under bump metallization (UBM) of the first component. A connection between the solder material and the second electrode pad is provided by a corresponding second UBM associated with a second electric component.

Conventional bump connections are failure prone. Specifically, cracking of the one of the constituent elements of a bump connection can render the bump connection useless with respect to its electrical and/or mechanical function. As a consequence, the corresponding device may be useless if only a single bump connection fails.

Failure of a bump connection can take place during normal operation of the electric device. However, a failure can already take place during manufacturing steps of the device or of the device's components, e.g. when potentially dangerous materials are used during processing steps. Specifically, corrosive materials can jeopardize a bump connection but may be vital to processing steps for manufacturing the electric device or components.

Thus, what is wanted is an improvement in reliability of a bump connection, e.g. to enhance the reliability of electric devices and components and the yield of manufacturing steps. Specifically, corrosion-resistant bump connections are desired.

To that end, a bump pad enclosure according to the independent claim is provided. Dependent claims provide preferred embodiments of the bump pad enclosure, of a bump connector, of an electric component, of an electric device and of a method of manufacturing an electric component.

The bump pad enclosure comprises an electrode pad, a UBM and a first shield. The first shield covers at least a first perimeter area of the electrode pad. The first shield is provided and configured to shield the first perimeter area from a detrimental influence of the environment.

The environment can be the environment during manufacturing processes or the environment of the corresponding device or component being stored or being used by a person.

It is possible that the environment comprises a corrosive agent and/or water. Specifically, it is possible that the environment comprises moisture.

The first perimeter area of the first shield may be located at the perimeter of the interface between the corresponding solder material connected to the UBM and the UBM.

It is possible that the solder material comprises tin or silver or a tin silver alloy. Further, it is possible that the electrode pad comprises aluminum, copper or an aluminum/copper alloy. When a corrosive agent comes in contact with UBM or the electrode pad, then corrosion of the corresponding materials can take place which can lead to the destruction of correspondingly known bump connections. Thus, specifically the perimeter area of the interface between the solder material and the UBM (because the interface area between the solder material and the UBM is usually constrained horizontally, e.g. by an electrode pad defining ring) is prone to defects because this area establishes a path for corrosive agents entering the bump pad construction.

However, instead of a ring, an elliptical, rectangular, oval or quadratic shape is also possible.

In the case of an oval shape the shape can be defined by a shape similar to the area enclosed by the coordinates (x, y) that comply with the equation $$x^2/4 + y^2/(1-kx) = 1 \quad \text{(eqn. 1)}$$

with 0<k<1; e.g. with k=0.2.

It is further possible that the footprint of the shape of the UBM has a stadium-like shape (i.e. consisting of two half circles and a rectangular arranged between the two half circles).

The presence of the first shield, particularly the shielding—by the first shield—of this sensitive first perimeter area from detrimental influences of the environment substantially reduces the probability of corrosive agents entering the sensitive areas of the bump pad construction.

Thus, the reliability of the corresponding bump connection is substantially increased and, as a result thereof, the reliability of corresponding components and devices is also increased.

For the same reason the yield of manufacturing processes is increased leading to lower manufacturing costs also.

Correspondingly, it is possible that the first shield is a moisture shield.

Thus, the first shield is a shield that protects the bump pad construction from water molecules entering the construction.

It is possible that the first shield has a thickness t with t≤500 nm or t≤400 nm or t≤300 nm.

Further, it is possible that the first shield has a thickness t that is 25 nm or larger.

The first shield can be provided as a layered structure where the extension of the shield's material in directions orthogonal to the thickness direction are substantially larger than the thickness. Thus, the thickness of the first shield is independent from the orientation of the shield. Specifically, it is possible that the shield's material is attached to a horizontal surface at one place and to a vertical or tilted surface (tilted with respect to the horizontal plane) at another place.

However, it is specifically possible that the provided thickness is at least partially defining the thickness of the shield in a vertical (z) direction.

In this context, the main top surface of an electric component determines the orientation of a horizontal plane which extends along the xy direction. Correspondingly, the z direction extends along the vertical direction.

It is possible that the first shield comprises or consists of a material selected from a silicon nitride, e.g. $Si_xN_y$ (with 2.5≤x≤3.5; 3.5≤y≤4.5) or a stoichiometric silicon nitride $Si_3N_4$a, an aluminium oxide $Al_2O_3$, a silicon oxide, $SiO_2$, a zirconium oxide, $ZrO_2$, a titanium oxide, $TiO_2$, a compound comprising a silicon, nitrogen and oxygen, e.g. a compound comprising silicon nitride and silicon oxide, a compound comprising aluminium, oxygen and silicon, e.g. a compound comprising aluminium oxide and silicon oxide, e.g. a compound comprising $Al_2O_3$ and $SiO_2$, a compound comprising aluminium, oxygen and zirconium, e.g. a compound comprising aluminium oxide and zirconium oxide, e.g. a compound comprising $Al_2O_3$ and $ZrO_2$, a compound comprising aluminium, oxygen and titanium, e.g. a compound comprising aluminium oxide and titanium oxide, e.g. a compound comprising $Al_2O_3$ and $TiO_2$.

In general, it is preferred that the first shield comprises a material that provides a strong barrier against corrosive agents such as water.

The first shield can be provided utilizing conventional material deposition techniques such as physical or chemical vapor deposition such as sputtering or ALD (Atomic Layer Deposition). The first shield can also be obtained by applying structuring techniques including the deposition of a resist material and the removal of material of the first shield.

It is possible that the first shield comprises a single-layer construction or a multi-layer construction.

When the first shield comprises a single-layer construction then the first shield consists of a homogenous material. If the first shield comprises a multi-layer construction then a plurality of two or more layers, the materials of which can be chosen from the selection stated above, can be arranged one on another to establish a multi-layer barrier again unwanted corrosive agents.

Thus, the first shield establishes an effective barrier closing typical corrosive agents entering paths to the construction of conventional bump connections.

It is possible that the bump pad enclosure further comprises a covering element. The covering element can cover at least partially an area of a top surface of the first shield.

The covering element can also comprise or consist of a material or a material/layer construction as described above. Specifically, the covering element can have a thickness that exceeds the thickness of the first shield. The covering element can contribute to the mechanical stability of the bump connection and have an inner vertical flank and an outer vertical flank. Specifically, the inner vertical flank can essentially define the interface area between the UBM and the solder material.

In a preferred bump pad enclosure the covering element comprises a silicon oxide such as SiO2 and/or a silicon nitride such as $Si_xN_y$ (with $2.5 \leq x \leq 3.5$; $3.5 \leq y \leq 4.5$) such as $Si_3N_4$.

It is possible that the bump pad enclosure further comprises a second shield. The second shield covers at least a second perimeter area of the electrode pad. Further, it is possible that the second shield is provided and configured to shield the second perimeter area from a detrimental influence of the environment.

Specifically, it is possible that the second shield augments the first shield in protecting the construction of the bump connection against external detrimental influences.

Correspondingly, it is possible that the second shield is a moisture shield.

It is possible that the second shield has a thickness t2 with $t2 \leq 500$ nm or $t2 \leq 400$ nm or $t2 \leq 300$ nm.

The second shield can also comprise or consist of the material group as stated above.

Specifically, it is possible that the first shield comprises or consists of silicon nitride (e.g. $Si_xN_y$ (with $2.5 \leq x \leq 3.5$; $3.5 \leq y \leq 4.5$), e.g. $Si_3N_4$) and that the second shield comprises or consists of silicon nitride (e.g. $Si_xN_y$ (with $2.5 \leq x \leq 3.5$; $3.5 \leq y \leq 4.5$), e.g. $Si_3N_4$).

Also, it is possible that the first shield comprises or consists of $Al_2O_3$ and that the second shield comprises or consists of silicon nitride (e.g. $Si_xN_y$ (with $2.5 \leq x \leq 3.5$; $3.5 \leq y \leq 4.5$), e.g. $Si_3N_4$).

Also, it is possible that the first shield comprises or consists of silicon nitride (e.g. $Si_xN_y$ (with $2.5 \leq x \leq 3.5$; $3.5 \leq y \leq 4.5$), e.g. $Si_3N_4$) and that the second shield comprises or consists of $Al_2O_3$.

It is possible that the second shield comprises a single-layer construction or a multi-layer construction.

Corresponding to the first shield it is possible that when the second shield comprises a single-layer construction then the second shield has a homogenous material.

Otherwise, the second material can comprise a plurality of two or more layers of which each can comprise or consist of one of the above-stated materials.

It is possible that the second shield is provided and configured to shield at least a vertical flank of the first shield from a detrimental influence of the environment.

Thus, it is possible that there is an interface area between the first shield and the second shield where material of the first shield is in direct contact with the material of the second shield.

Specifically, it is possible that this interface region between the first and the second shield is at a position that is typically part of a path of unwanted corrosive agents entering the construction of the bump connection.

It is possible that a bump connector comprises a bump pad enclosure as described above. The bump connector can further comprise solder material provided and configured to establish a bump connection.

The material of the electrode pad of the bump connector can be electrically and mechanically connected to a signal line at the surface of a carrier substrate. Correspondingly, it is also possible that the bump connector comprising the bump pad enclosure is arranged at the surface of the carrier substrate. The surface can be the surface that is directed to a corresponding oppositely oriented surface of a second electric component electrically and mechanically connected to the bump connector via a bump connection.

Further, an electric component can comprise a bump connector as described above arranged at a top surface of the electric component.

The bump connector of the electric component can be configured to and provided for establishing an electric and mechanical connection to a further electric component such that the two electric components establish at least a part of an electric device.

Correspondingly, an electric device can comprise one or two electric components as described above. A bump connection comprising a solder material between two bump connectors establishes the final electrical and mechanical contact between the two components.

A method of manufacturing an electronic component that comprises a bump pad enclosure as stated above can comprise the steps:
  providing an electrode pad,
  depositing material of the first shield at least in a first perimeter area,
  depositing material of a UBM.

Thus, bump pad enclosures are provided that enhance the reliability of bump connections. A bump connection comprises a solder material between two bump connectors where each bump connector is associated to one of two electric components and wherein at least one of the bump connectors comprises a bump pad enclosure as described above. However, it is appreciated if both bump connectors comprise a bump pad enclosure as described above.

With such bump connections the reliability and the yield during manufacturing processes are substantially enhanced. The risk of a corrosion-induced destruction of a bump connection leading to the failure of a whole device is reduced. Specifically, a corrosive agent entering path to the bump pad structure is effectively blocked.

The provision of first and/or second shields with a thickness of 500 nm or lower significantly reduces the risk of cracks of the layer construction.

The UBM can comprise a single-layer construction or a multi-layer construction. Specifically, the UBM can comprise an adhesive layer, e.g. with titanium for good adhesion to the electrode pad. It is possible that the UBM comprises nickel or gold or nickel and gold or a nickel/gold alloy at least at a top layer for providing a well solderable interface layer to the solder material.

A top level of the UBM can—in a vertical direction—extend beyond the vertical level of a covering element. However, it is also possible that the vertical level of the UBM is matched and equals the vertical level of the covering element. However, it is also possible that the vertical level—in the vertical direction away from the material of the electrode pad—extends the vertical level of the UBM.

Central aspects of the bump pad enclosure, a corresponding bump connection, a bump connector, an electric component or an electric device and details of preferred embodiments are shown in the accompanying schematic figures.

Figure 1:
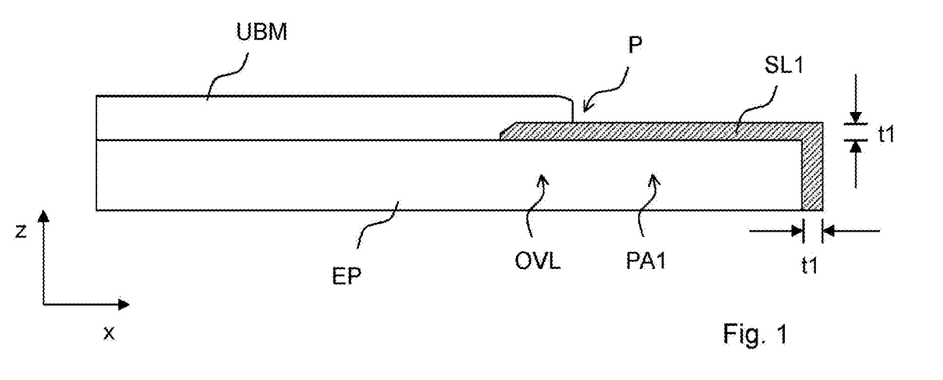
FIG. 1 shows a cross-section illustrating a possible arrangement of the first shield with respect to the electrode pad and the UBM.

FIG. 1 shows a cross-section through a segment of a bump pad illustrating the arrangement of the first shield SL1 at the first perimeter area PA1 on the electrode pad EP. Material of a UBM is arranged on the electrode pad EP such that there is an interface area between the UBM and the electrode pad. A critical area is the perimeter surrounding the interface between the UBM and the electrode pad EP establishing the entry of a path P via which corrosive agents can enter the pad construction. The provision of the first shield SL1 at the first perimeter area PA1 establishes an effective blockade for unwanted etching agents such that the path P no longer provides a way to the electrode pad EP.

The first shield SL1 has a thickness t1. At areas where first shield SL1 is arranged on a horizontal surface of the electrode pad EP the thickness of the first shield SL1 is defined by the extension of the shield's material in the vertical direction z.

However, it is also possible that material of the first shield SL1 is arranged at vertical or tilted sides of the electrode pad EP, e.g. as shown on the right-hand side of FIG. 1. Then, of course, the thickness of the shield SL1 is defined as its extension along a horizontal direction x.

In FIG. 1 the UBM provides a solderable interface at its top surface via which the UBM can be connected to another UBM of a further electric component.

An improved blocking of detrimental agents is specifically obtained by arranging the electrode pad EP, the first shield SL1 and the UBM such that an overlap, specifically in a horizontal direction, is obtained. Thus, there is an area where material of the electrode pad EP is covered by material of the first shield SL1 while simultaneously material of the first shield SL1 is covered by material of the UBM. This overlap OVL substantially reduces the risk of detrimental agents reaching the material of the electrode pad EP.

Figure 2:
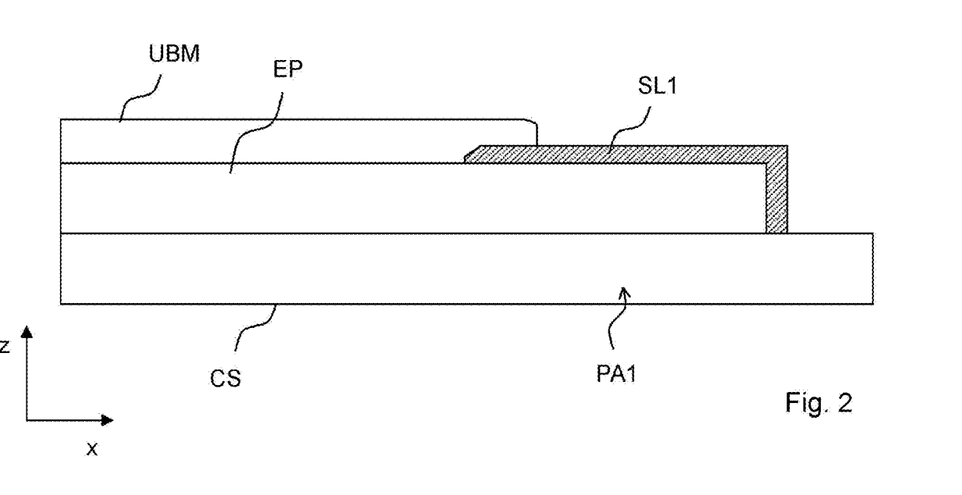
FIG. 2 shows the arrangement of the structure on a carrier substrate.

FIG. 2 illustrates that the bump connector comprising the first shield SL1 covering the electrode pad EP at least in the first perimeter area PA1 can be arranged on a carrier substrate CS. At the top surface of the carrier substrate CS the electrode pad EP can be extended in one horizontal direction to establish a signal line for connecting the electrode pad EP to an external circuit environment including other circuit elements arranged on or at the carrier substrate CS.

Figure 3:
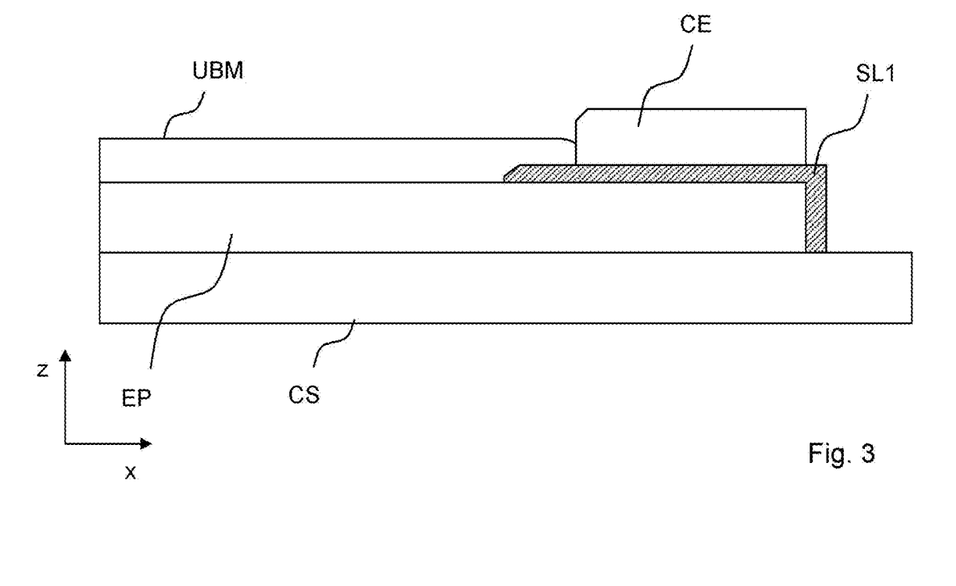
FIG. 3 shows the use of a covering element.

FIG. 3 shows the possibility of arranging a covering element CE at least partially on a top surface of the first shield SL. The material of the covering element CE can be used to limit the volume of the UBM in a horizontal direction. Thus, the covering element CE can be used to horizontally confine the UBM—and therefore the later bump—to a specific area on the electrode pad EP. Thus, the covering element CE determines the position of the rim area of the UBM.

The UBM can have a vertical level of its top surface that is below the top level of the covering element CE.

However, it is also possible that the top level of the UBM and of the covering elements CE are approximately matched.

Figure 4:
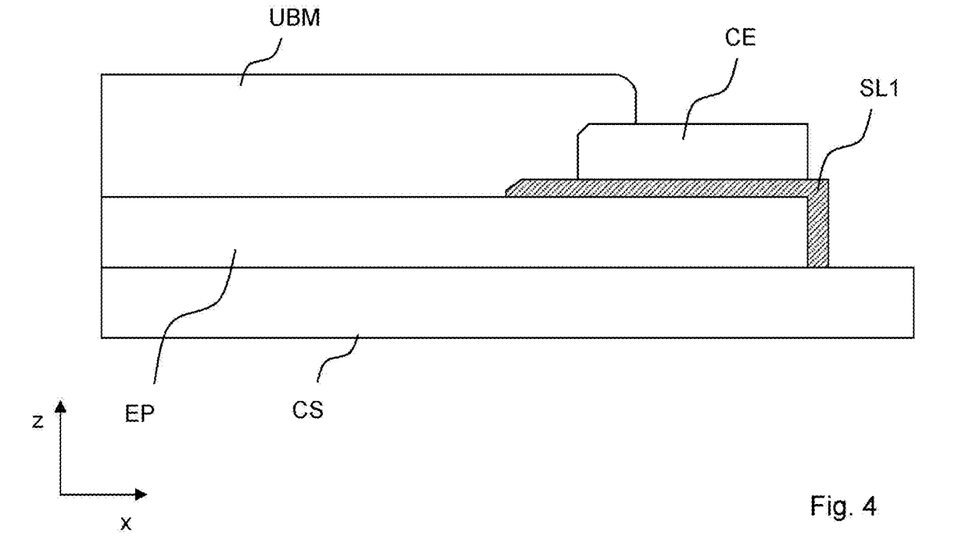
FIG. 4 shows the height of the UBM extending the height of the covering element.

In contrast, FIG. 4 illustrates the possibility of having a top level of the UBM exceeding the top level position of the covering element CE. Then, an inner flank of the covering element CE, i.e. a vertical flank of the covering element CE pointing towards the center of the bump connection in a horizontal direction, no longer establishes the horizontal confinement of the UBM. The UBM can go beyond the inner flank of the covering element CE in a horizontal direction.

Figure 5:
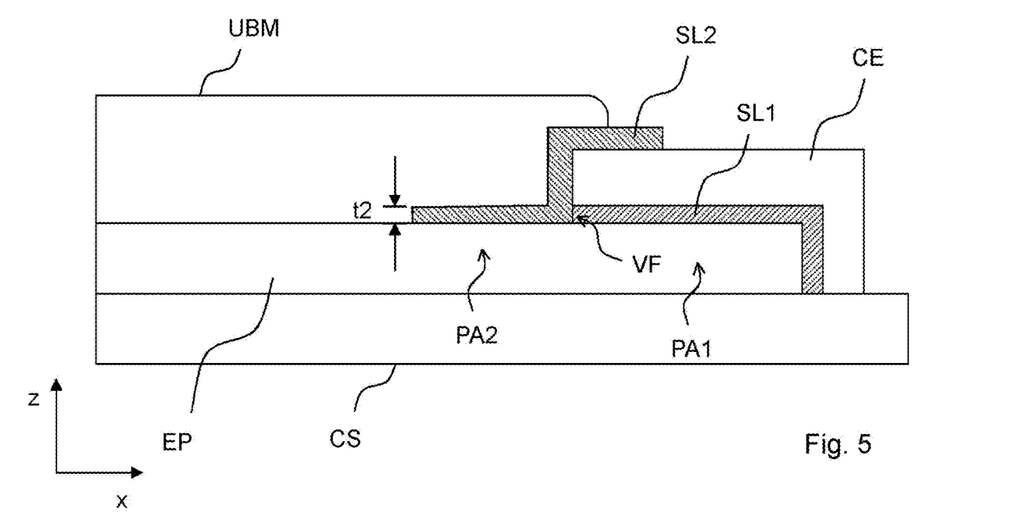
FIG. 5 shows the use of the second shield.

FIG. 5 illustrates the possibility of providing the second shield SL2 to further improve the resistance of the bump pad enclosure against unwanted agents. The second shield SL2 can have a second thickness t2. Further, the second shield SL2 can be in direct contact with the electrode pad EP at a second perimeter area PA2. The second perimeter area PA2 can be within the area surrounded by the first perimeter area PA1.

In particular, it is possible that the material of the second shield SL2 is in direct contact to—and therefore protects—the vertical flank VF of the material of the first shield SL pointing towards the center of the bump connection. Further, an additional overlap where material of the second shield SL2 overlaps material of the covering element CE exists such that a potential path for unwanted agents entering the construction is further blocked.

The vertical top level position of the UBM can exceed the vertical top level of a top surface of the second shield SL2 and of a vertical top level position of the covering element CE. Additionally, the vertical top level position of the second shield SL2 can extend beyond—in the vertical direction—the top level position of the covering element CE.

Figure 6:
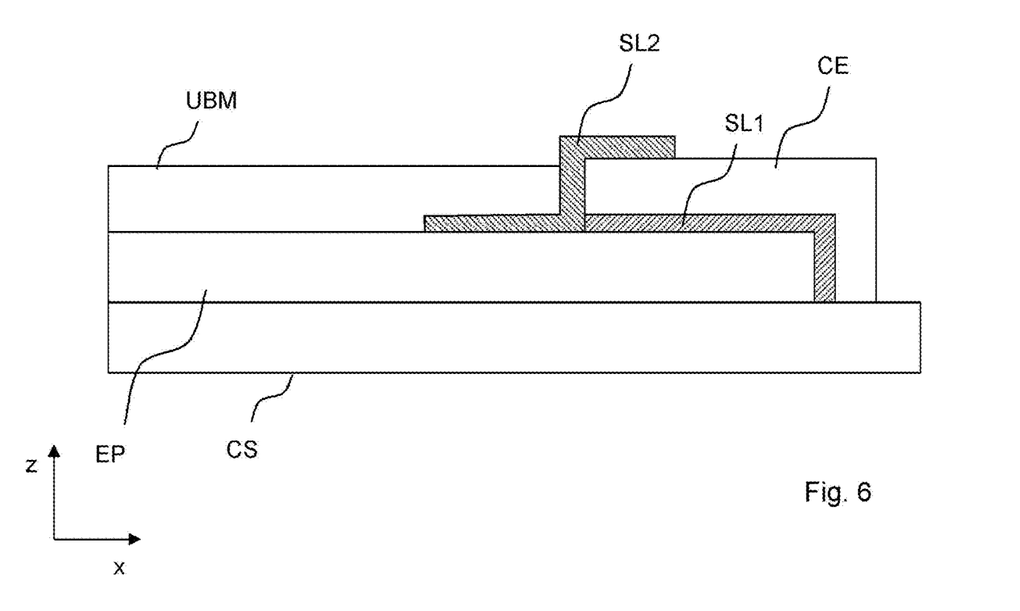
FIG. 6 shows a configuration with the second shield where the thickness of the UBM approximately equals the thickness of the covering element.

In contrast, FIG. 6 illustrates the possibility of having the top level position of the second shield SL2 extending beyond the top level position—in a vertical direction—of the UBM and of the covering element CE while the top level positions of the UBM and of the covering element are approximately matched. Then, the upper inner vertical flank of the second shield SL2 essentially determines the extension of the UBM in the lateral direction.

Figure 7:
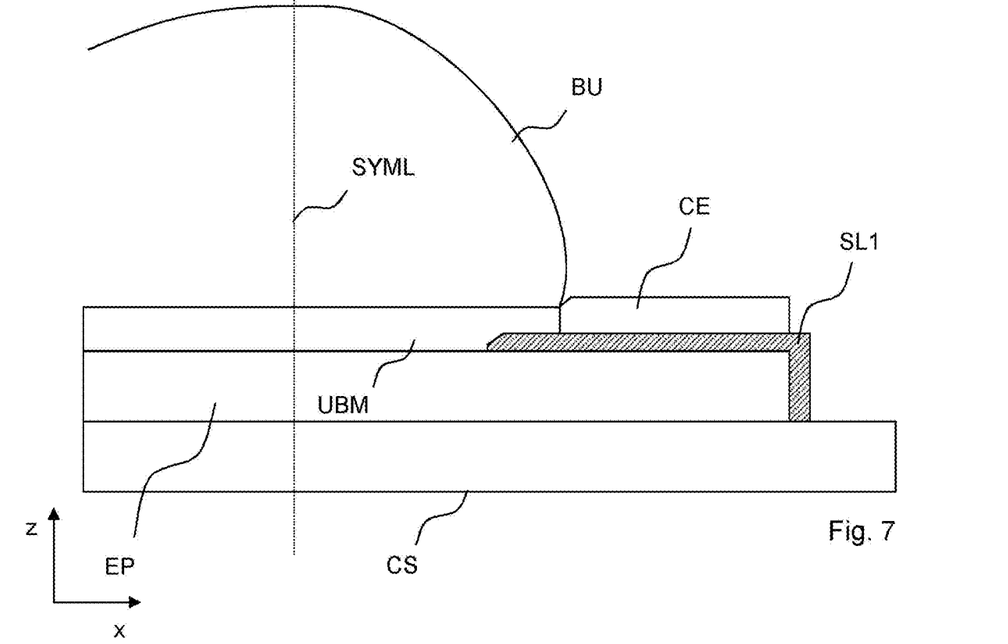
FIG. 7 illustrates the relationship between the bump connector and a solder bump.

FIG. 7 shows a configuration where solder material establishing at least partially a bump sphere of a bump BU is arranged on the UBM. The bump BU can be essentially symmetrical with respect to a rotation symmetry having a symmetry line SYML being aligned orthogonal to the horizontal plane. Thus, the symmetry line SYML essentially extends along the vertical direction z. The bump pad enclosure comprising the first shield SL1 and the UBM and—if present—the covering element CE can also be symmetric with respect to the rotational symmetry having the symmetry line SYML.

Thus, with respect to a top view, the bump pad enclosure can follow the perimeter of a circle. However, it is also possible that the bump pad enclosure has an elliptical, rectangular, oval or quadratic shape.

Figure 8:
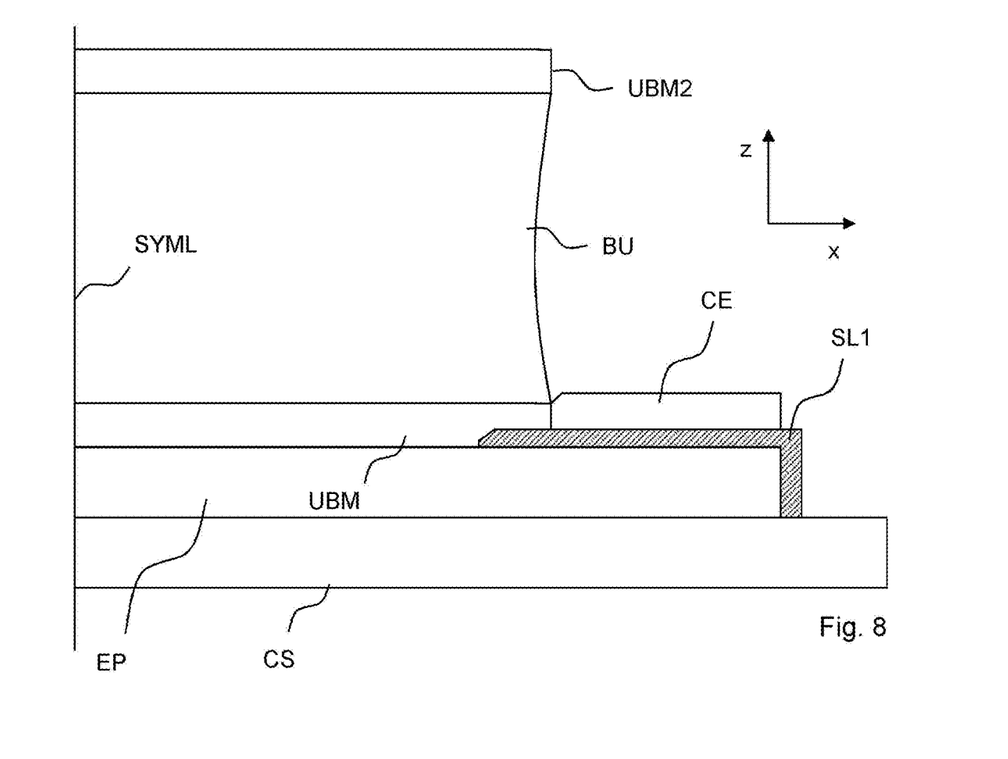
FIG. 8 illustrates details of a bump connection between a UBM of the bump connector to a second UBM.

FIG. 8 illustrates the material of the bump BU in a connected configuration. Specifically, the solder material of the bump BU electrically and mechanically connects the UBM of the bump pad having the bump pad enclosure as described above and a second UBM, UBM2, that is part of a second bump connector. Thus, two bump connectors belonging to two different electric components can be connected. Thus, reliable electrical and mechanical connections between different electrical components, e.g. to establish an electric device, can be obtained.

Figure 9:
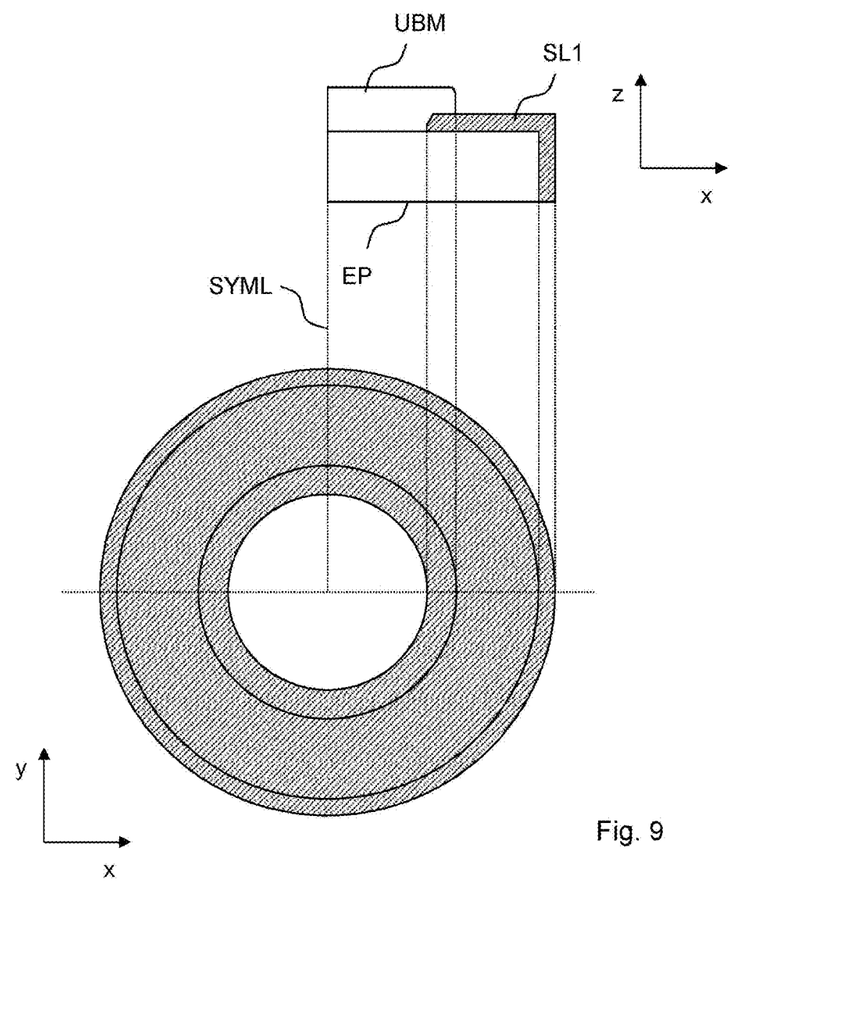
FIG. 9 shows corresponding elements of the bump pad enclosure in a cross-sectional view (top portion) and a top view (bottom portion).

The round symmetry—with respect to a vertical symmetry line—as described above in a top view perspective is illustrated in the bottom part of FIG. 9 illustrating the relationship to the elements shown in the cross-sections of FIGS. 1 to 8. The material of the first shield SL1 is overlapped by material of the UBM at each rim position of the UBM such that a full overlap is obtained such that potential paths for unwanted agents are effectively blocked at every lateral rim position of the bump pad connector.

Neither the bump pad enclosure nor the corresponding bump connector nor the electric component nor the electric device nor the method of manufacturing an electric component are limited by the technical details explained above and shown in the figures. Bump connections can comprise further elements such as further layers enhancing electrical conductivity, mechanical stability and physical adhesion of the layer system. Also, further shield elements and overlap regions are also possible.

LIST OF REFERENCE SIGNS

BU: bump
CE: covering element
CS: carrier substrate
EP: electrode pad
OVL: overlap region
P: possible path for unwanted agents
PA1: first perimeter area
PA2: second perimeter area
SL1, SL2: first, second shield
SL2SYML: symmetry line
t1, t2: thickness of first, second shield
UBM: under bump metallization
UBM2: second UBM, UBM of a second electric component
VF: vertical flank of the first shield SL
x, y: horizontal directions
z: vertical direction

The invention claimed is:

1. A bump pad enclosure, comprising:
    an electrode pad having an electrode pad center surface and a first perimeter area on a surface of the electrode pad, wherein the first perimeter area surrounds the electrode pad center surface;
    an under bump metallization on or above the electrode pad center surface;
    a first shield configured to shield the first perimeter area from a detrimental influence of an environment, wherein the first shield covers at least the first perimeter area of the electrode pad; and
    a covering element formed on the first shield, wherein the first shield is positioned between the first perimeter area and the covering element, and wherein the first shield is positioned between the electrode pad and the covering element.

2. The bump pad enclosure of claim 1, wherein the first shield is a moisture shield.

3. The bump pad enclosure of claim 1, wherein the first shield has a thickness t with t≤500 nm or t≤400 nm or t≤300 nm.

4. The bump pad enclosure of claim 1, wherein the first shield comprises a material selected from SiNx, SixNy (with 2.5≤x≤3.5; 3.5≤y≤4.5), Si3N4, Al2O3, SiO2, ZrO2, TiO2 and SiO2, Al2O3 and SiO2, Al2O3 and ZrO2, Al2O3 and TiO2.

5. The bump pad enclosure of claim 1, wherein the first shield comprises a single-layer construction or a multi-layer construction.

6. The bump pad enclosure of claim 1, wherein the covering element comprises a material selected from SiNx, SixNy (with 2.5≤x≤3.5; 3.5≤y≤4.5), Si3N4, Al2O3, SiO2, ZrO2, TiO2, SixNy (with 2.5≤x≤3.5; 3.5≤y≤4.5) and SiO2, Si3N4 and SiO2, Al2O3 and SiO2, Al2O3 and ZrO$_2$, Al2O3 and TiO2.

7. The bump pad enclosure of claim 1, wherein the covering element comprises at least one of SiO2 or a silicon nitride.

8. The bump pad enclosure of claim 1, further comprising a second shield, wherein:
    the second shield covers at least a second perimeter area of the electrode pad, and
    the second shield is provided and configured to shield the second perimeter area from a detrimental influence of the environment.

9. The bump pad enclosure of claim 8, wherein the second shield is a moisture shield.

10. The bump pad enclosure of claim 8, wherein the second shield has a thickness t2 with t2≤500 nm or t2≤400 nm or t2≤300 nm.

11. The bump pad enclosure of claim 8, wherein the second shield comprises a material selected from SiNx, SixNy (with 2.5≤x≤3.5; 3.5≤y≤4.5), Si3N4, Al2O3, SiO2, ZrO2, TiO2, SixNy (with 2.5≤x≤3.5; 3.5≤y≤4.5) and SiO2, Si3N4 and SiO2, Al2O3 and SiO2, Al2O3 and ZrO2, Al2O3 and TiO2.

12. The bump pad enclosure of claim 8, wherein the second shield comprises a single-layer construction or a multi-layer construction.

13. The bump pad enclosure of claim 8, wherein the second shield is provided and configured to shield at least partially a vertical flank of the first shield from a detrimental influence of the environment.

14. The bump pad enclosure of claim 1, wherein the bump pad enclosure is part of a bump connector, the bump connector including solder material provided and configured to establish a bump connection.

15. The bump pad enclosure of claim 14, wherein the bump connector is part of an electric component.

16. The bump pad enclosure of claim 15, wherein the electric component is part of an electric device.

17. A method of manufacturing an electric component comprising a bump pad enclosure including an electrode pad, an under bump metallization, a covering element, and a first shield, wherein the first shield covers at least a first perimeter area of the electrode pad and the first shield is provided and configured to shield the first perimeter area from a detrimental influence of an environment, the method comprising:

providing the electrode pad with an electrode pad center surface and the first perimeter area on a surface of the electrode pad, wherein the first perimeter area surrounds the electrode pad center surface;

depositing material of the first shield on or over at least in the first perimeter area;

depositing material of the under bump metallization on or over at least the electrode pad center surface; and     forming material of the covering element on or over the material of the first shield, wherein the covering element is formed with the first shield positioned between the first perimeter area and the covering element.

\* \* \* \* \*